US009666497B2

(12) United States Patent
Ogasawara

(10) Patent No.: US 9,666,497 B2
(45) Date of Patent: May 30, 2017

(54) CRYSTAL DEVICE

(71) Applicant: KYOCERA Crystal Device Corporation, Higashine-shi, Yamagata (JP)

(72) Inventor: Katsuhiro Ogasawara, Higashine (JP)

(73) Assignee: KYOCERA CRYSTAL DEVICE CORPORATION, Higashine-shi (JP)

( * ) Notice: Subject to any disclaimer, the term of this patent is extended or adjusted under 35 U.S.C. 154(b) by 0 days.

(21) Appl. No.: 15/050,869

(22) Filed: Feb. 23, 2016

(65) Prior Publication Data
US 2016/0379908 A1 Dec. 29, 2016

(30) Foreign Application Priority Data

Jun. 25, 2015 (JP) ................. 2015-127230
Aug. 27, 2015 (JP) ................. 2015-167614

(51) Int. Cl.
*H01L 41/08* (2006.01)
*H01L 23/02* (2006.01)
*H01L 41/047* (2006.01)
*H01L 41/053* (2006.01)

(52) U.S. Cl.
CPC ............ *H01L 23/02* (2013.01); *H01L 41/047* (2013.01); *H01L 41/053* (2013.01)

(58) Field of Classification Search
CPC .................................. H03H 9/19; H03H 9/053
USPC .................................. 310/344, 348
See application file for complete search history.

(56) References Cited

U.S. PATENT DOCUMENTS

| 5,801,474 A * | 9/1998 | Sakairi | H03H 9/059 310/313 R |
| 5,821,665 A * | 10/1998 | Onishi | H03H 9/059 310/313 R |
| 7,915,791 B2 * | 3/2011 | Akane | H03H 9/1021 310/344 |
| 8,541,928 B2 * | 9/2013 | Shimao | H03H 9/19 310/344 |
| 2010/0231094 A1 * | 9/2010 | Kameda | H03H 9/1021 310/344 |
| 2015/0349744 A1 * | 12/2015 | Sasaoka | H03H 9/17 310/344 |

FOREIGN PATENT DOCUMENTS

JP 2002-111435 A 4/2002

\* cited by examiner

*Primary Examiner* — J. San Martin
(74) *Attorney, Agent, or Firm* — Westerman, Hattori, Daniels & Adrian, LLP

(57) ABSTRACT

The crystal device has a rectangular substrate, a frame which is provided along the outer circumferential edge of the upper surface of the substrate, an electrode pad which is provided on the upper surface of the substrate, a wiring pattern which is electrically connected to the electrode pad and is provided on the upper surface of the substrate, a crystal element which is mounted on the electrode pad, and a lid for air-tight sealing the crystal element. The thickness of the electrode pad in the vertical direction differs from the thickness of the wiring pattern in the vertical direction.

7 Claims, 7 Drawing Sheets

CRYSTAL DEVICE

TECHNICAL FIELD

The present invention relates to a crystal device used in for example electronic equipment.

BACKGROUND ART

A crystal device utilizes a piezoelectric effect of a crystal element to cause thickness shear vibration so that two surfaces of a crystal plate move from each other and thereby generate a signal having a specific frequency. A crystal device having a crystal element mounted through a conductive adhesive on electrode pads provided on a substrate has been proposed (see for example the following Patent Literature 1). In such a crystal device, wiring patterns which are electrically connected to the electrode pads provided on the upper surface of the substrate are provided on the upper surface of the board.

CITATION LIST

Patent Literature

Patent Literature 1. Japanese Patent Publication No. 2002-111435

SUMMARY OF INVENTION

Technical Problem

The crystal device explained above has been remarkably reduced in size. The crystal element mounted on the substrate has been reduced in size as well. In such a crystal device, the areas of the electrode pads have become smaller as well. Therefore, the coated conductive adhesive can sometimes overflow along the wiring patterns. Further, due to the conductive adhesive overflowing to the top of the wiring patterns, the connection strength between the crystal element and the conductive adhesive fell, therefore the crystal element can sometimes peel off from the electrode pads.

Accordingly, a crystal device capable of maintaining the connection strength between the crystal element and the conductive adhesive is desirably provided.

Solution to Problem

A crystal device according to one aspect of the present invention has a rectangular substrate, a frame which is provided along an outer circumferential edge of an upper surface of the substrate, an electrode pad which is provided on the upper surface of the substrate, a wiring pattern which is electrically connected to the electrode pad and is provided on the upper surface of the substrate, a crystal element which is mounted on the electrode pad, and a lid for air-tight sealing the crystal element. A thickness of the electrode pad in a vertical direction is different from a thickness of the wiring pattern in the vertical direction.

Advantageous Effect of Invention

By configuring the device as described above, in the crystal device, the conductive adhesive does not easily leak and spread on the upper surface of the wiring patterns, therefore it becomes possible to stably mount the crystal element on the electrode pads through the conductive adhesive. Further, since the crystal element can be stably mounted on the electrode pads in the crystal device, it becomes possible to stably output an oscillation frequency of the crystal element.

DESCRIPTION OF EMBODIMENTS

First Embodiment

Figure 1:
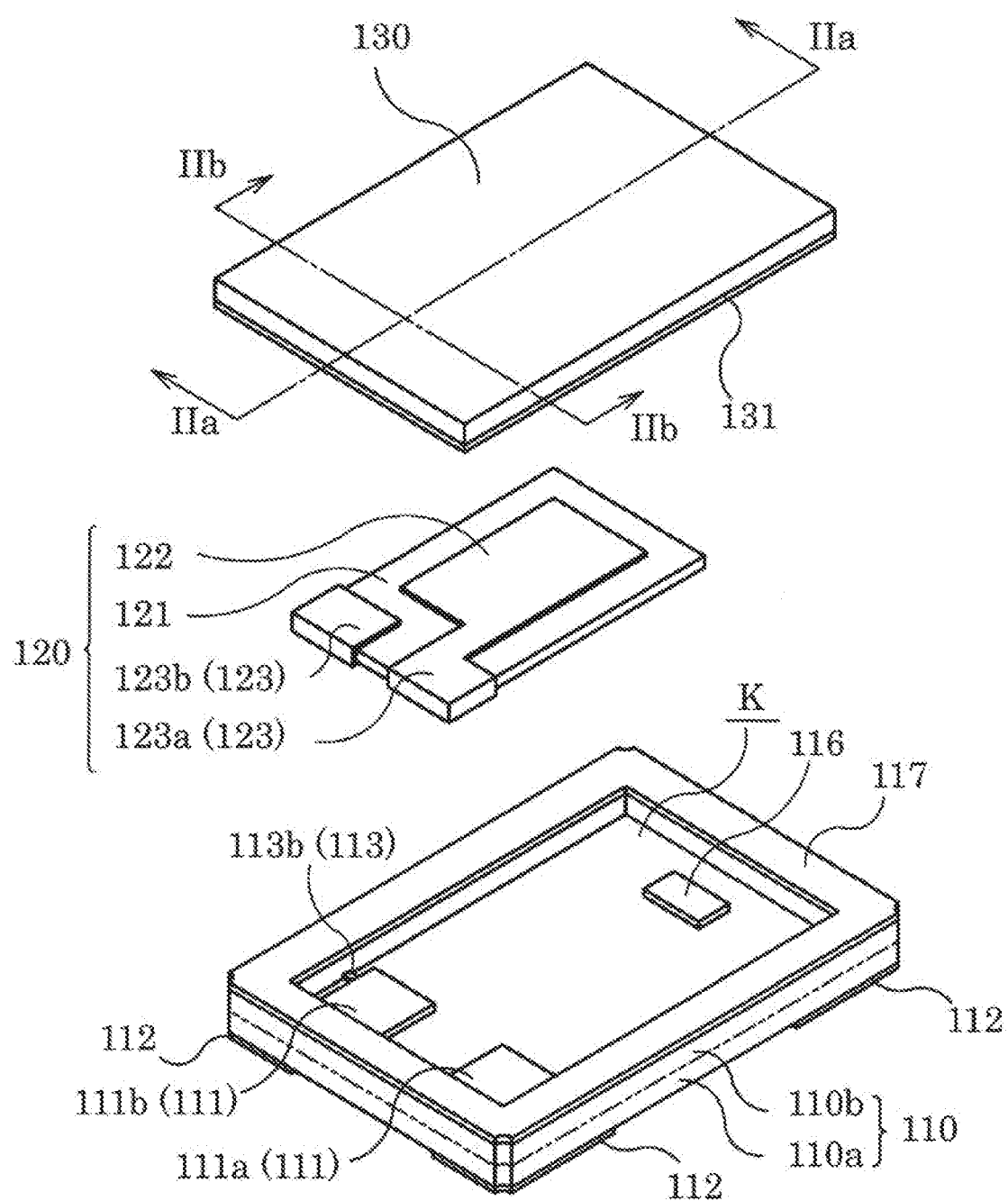
FIG. 1 is a disassembled perspective view showing a crystal device in a first embodiment.
Figure 2A:
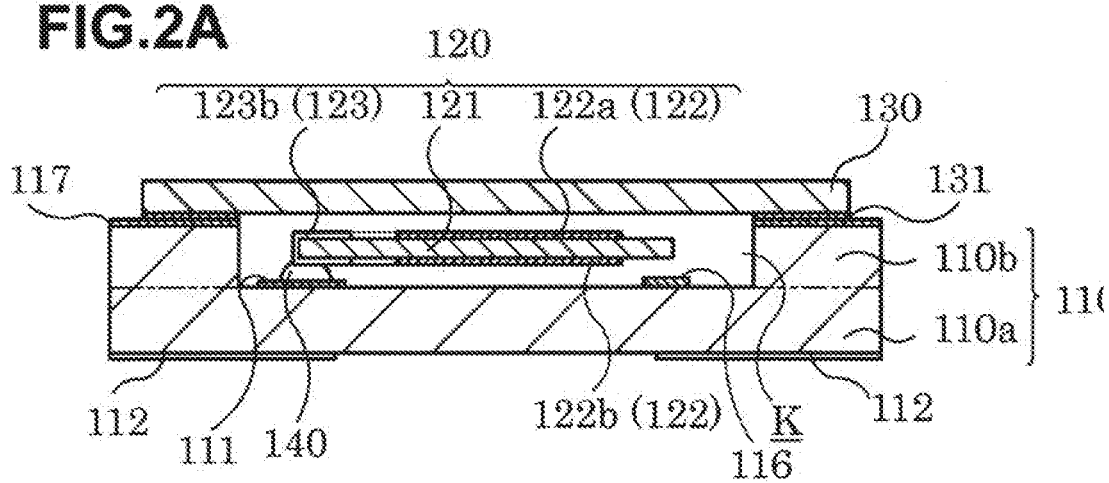
FIG. 2A is a cross-sectional view taken along IIa-IIa of the crystal device shown in FIG. 1.
Figure 2B:
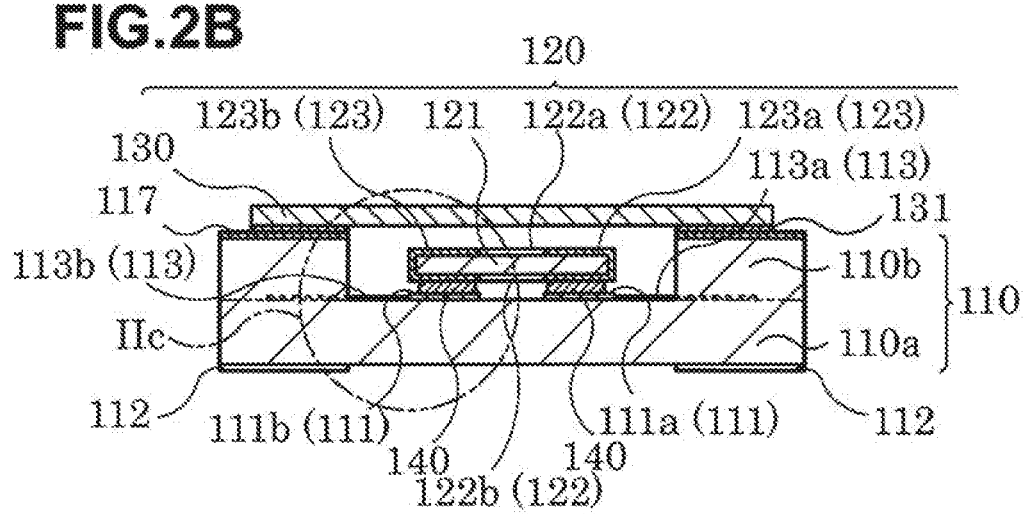
FIG. 2B is a cross-sectional view taken along IIb-IIb of the crystal device shown in FIG. 1.
Figure 2C:
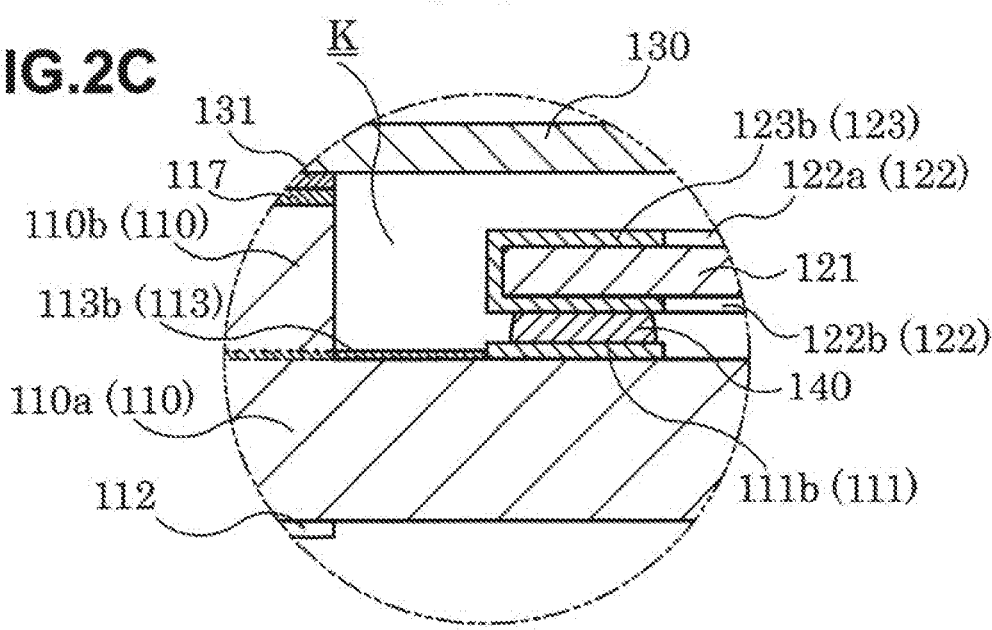
FIG. 2C is an enlarged view of a IIc portion in FIG. 2B.
Figure 3:
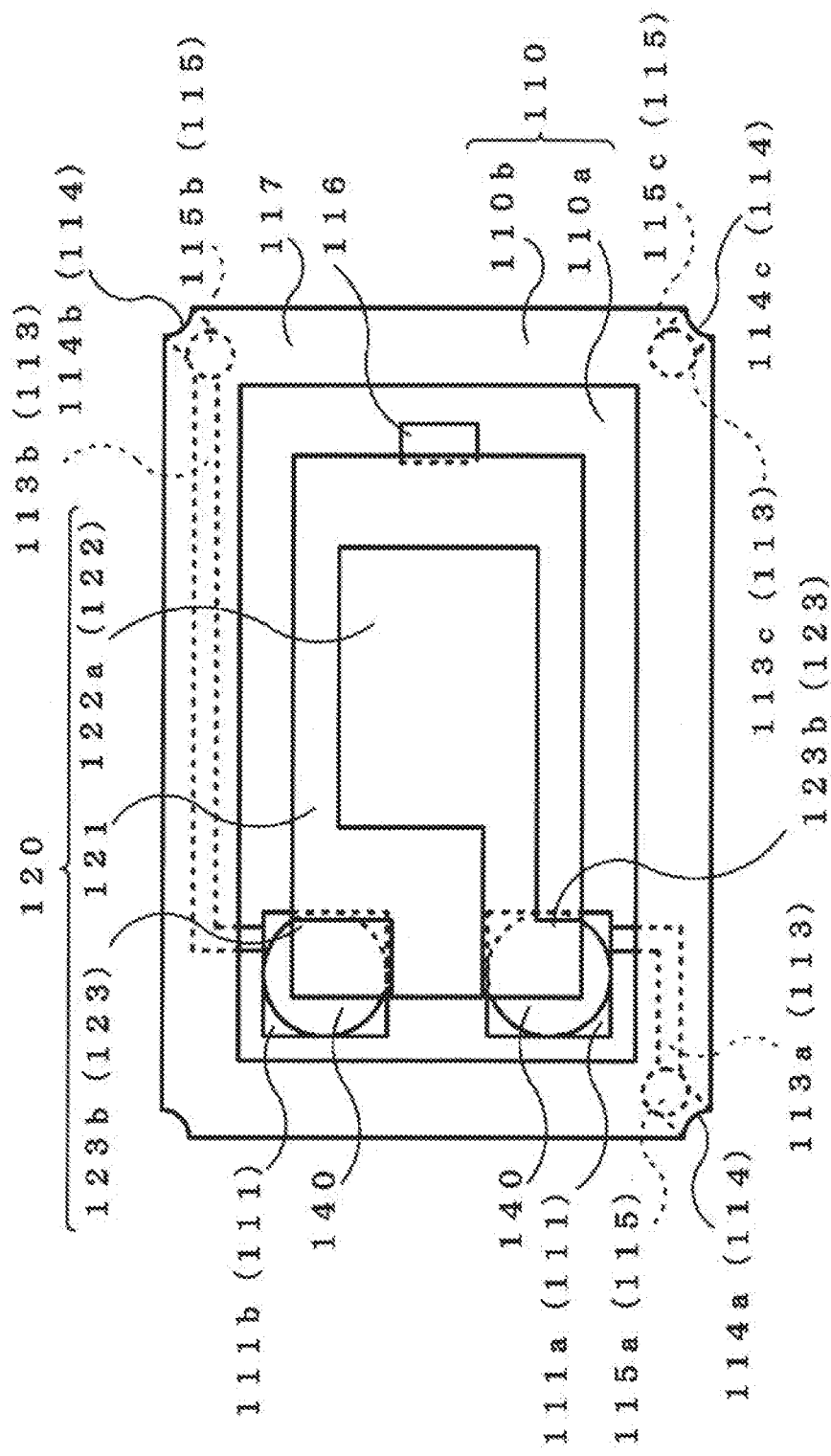
FIG. 3 is a plan view showing a state where a lid of the crystal device in the first embodiment is detached.

A crystal device of the present embodiment, as shown in FIG. 1 to FIG. 3, includes a package 110, a crystal element 120 which is bonded to the upper surface of the package 110, and a lid 130 which is bonded to the upper surface of the package 110. In the package 110, a concave portion K which is surrounded by the upper surface of the substrate 110a and inner side surfaces of the frame 110b is formed. Such crystal device is used for outputting a reference signal used in electronic equipment etc.

The substrate 110a is rectangular shaped and functions as a mounting member for mounting the crystal element 120 on its upper surface. On the upper surface of the substrate 110a, a pair of electrode pads 111 for bonding the crystal element 120 is provided. The substrate 110a is configured by an insulation layer of for example an alumina ceramic or glass ceramic or other ceramic material. The substrate 110a may be formed using one insulation layer or by laminating a plurality of insulation layers. On the surface and in the internal portion of the substrate 110a, wiring patterns 113 and conductor portions 114 are provided for electrically connecting the electrode pads 111 provided on the upper surface and external terminals 112 provided on the lower surface of the substrate 110a.

The frame 110b is arranged on the upper surface of the substrate 110a and forms the concave portion K in the upper surface of the substrate 110a. The frame 110b is for example made of a ceramic material such as an alumina ceramic or glass ceramic and formed integrally with the substrate 110a.

Here, the size of the concave portion K will be explained by taking as an example a case where the dimension of one side when viewing the package 110 from a plane is 1.0 to 3.0 mm and the dimension of the package 110 in the vertical direction is 0.2 to 1.5 mm. The length of the long side of the concave portion K is 0.7 to 2.0 mm, and the length of the short side becomes 0.5 to 1.5 mm. Further, the length of the concave portion K in the vertical direction becomes 0.1 to 0.5 mm.

Further, at the four corners of the lower surface of the substrate 110a, external terminals 112 are provided. Two terminals among the external terminals 112 are electrically connected to the electrode pads 111 which are provided on the upper surface of the substrate 110a. Further, the external terminals 112 which are electrically connected to the electrode pads 111 are provided so that they are positioned at the diagonal corners of the lower surface of the substrate 110a.

The electrode pads 111 are for mounting the crystal element 120. The electrode pads 111 are provided as a pair on the upper surface of the substrate 110a and are provided so as to be adjacent to each other along one side of the substrate 110a. The electrode pads 111 are configured by a first electrode pad 111a and second electrode pad 111b. The electrode pads 111 are electrically connected to the external terminals 112 provided on the lower surface of the substrate 110a through the wiring patterns 113, conductor portions 114, and via conductors 115 which are provided at the substrate 110a.

The external terminals 112 are used for bonding with the mounting pads (not shown) on the external mounting substrate of an electrical apparatus or the like. The external terminals 112 are provided at the four corners of the lower surface of the substrate 110a. At least one of the external terminals 112 is electrically connected through a via conductor 115 to a sealing-use conductor pattern 117. Further, at least the one of the external terminals 112 is connected to a mounting pad which is connected to a reference potential, here, the ground potential, on the mounting substrate of the electronic apparatus or the like. Due to this, the lid 130 bonded to the sealing-use conductor pattern 117 is connected to a third external terminal 112c which becomes the ground potential. Accordingly, the sealing property in the concave portion K by the lid 130 is improved.

The wiring patterns 113 are for electrically connecting the electrode pads 111 to conductor portions 114 and via conductors 115. First ends of the wiring patterns 113 are electrically connected to the electrode pads 111, while the other ends of the wiring patterns 113 are electrically connected to the conductor portions 114 and via conductors 115. The wiring patterns 113 are configured by a first wiring pattern 113a, second wiring pattern 113b, and third wiring pattern 113c.

Further, the wiring patterns 113 are provided so as to be superimposed on the frame 110b when viewed by a planar view. By providing them in this way, the crystal device suppresses generation of stray capacitance between the wiring patterns 113 and the crystal element 120, therefore stray capacitance given to the crystal element 120 is reduced, so fluctuation of the oscillation frequency can be suppressed. Further, even when an external force is applied to the crystal device and a bending moment is generated in the long side direction of the frame 110b, because of provision of the frame 110b in addition to the substrate 110a, the portion at which the frame 110b is provided becomes resistant to deformation. Accordingly, the wiring patterns 113 provided at positions superimposed on the frame 110b when viewed by a planar view become resistant to breakage, therefore the output of oscillation frequency can be kept from being stopped.

Further, the first wiring pattern 113a is electrically connected to the first electrode pad 111a, first conductor portion 114a, and first via conductor 115a. The first wiring pattern 113a extends from the first electrode pad 111a toward the nearby long side of the frame 110b. A portion of the first wiring pattern 113a is exposed. The second wiring pattern 113b is electrically connected to the second electrode pad 111b, second conductor portion 114b, and second via conductor 115b. The second wiring pattern 113b extends from the second electrode pad 111b toward the nearby long side of the frame 110b. A portion of the second wiring pattern 113b is exposed.

In this way, portions of the wiring patterns 113 extend from the electrode pads 111 toward the long side of the frame 110b and are exposed in the concave portion K. Due to this, at the time of mounting the crystal element 120, even if the conductive adhesive 140 overflows from the tops of the electrode pads 111, it flows out along the tops of the wiring patterns 113 having a good wettability with the conductive adhesive 140, therefore will not flow out to the center direction of the package 110. Therefore, adhesion of the conductive adhesive 140 to an excitation-use electrode 122 can be suppressed.

Further, the portions of the exposed wiring patterns 113 become line symmetric with respect to a line L which passes through a center point P of the substrate 110a and is parallel to the long sides of the substrate 110a. By the exposed first wiring pattern 113a and the exposed second wiring pattern 113b being provided at positions where they become line symmetric with respect to the line L which passes through the center point P of the substrate 110a and is parallel to the long sides of the substrate 110a in this way, even if the conductive adhesive 140 overflows from the tops of the electrode pads 111 when mounting the crystal element 120, the amounts of the overflowing conductive adhesive 140 easily become equal, therefore inclination of the crystal element 120 can be suppressed.

Further, the electrode pads 111 are provided so that their thickness in the vertical direction becomes thicker than the thickness of the wiring patterns 113 in the vertical direction as shown in FIG. 2C. By configuring the device in this way, steps are provided at borders of the electrode pads 111 and the wiring patterns 113, a radius of curvature of an interface of the conductive adhesive 140 at the step becomes small, and a surface free energy becomes large, therefore it becomes hard for the conductive adhesive 140 coated on the electrode pads 111 to ride over the steps and leak and spread onto the tops of the wiring patterns 113. Accordingly, the crystal element 120 can be stably mounted on the electrode pads 111 through the conductive adhesive 140, therefore fluctuation of the oscillation frequency of the crystal element 120 can be reduced.

The conductor portions 114 are for electrically connecting the wiring patterns 113 and the external terminals 112. The conductor portions 114 are provided in the internal portions of notches provided in the corner portions of the substrate 110a. The two ends of the conductor portions 114 are connected to the wiring patterns 113 and external terminals 112. By connection in this way, the electrode pads 113 are electrically connected through the wiring patterns 113, conductor portions 114, and via conductors 115 to the external terminals 112.

The via conductors 115 are for electrically connecting the external terminals 112 to the wiring patterns 113 or sealing-use conductor pattern 117. The two ends of the via conductors 115 are connected to the external terminals 112 and the wiring patterns 113 or sealing-use conductor pattern 117. By connection in this way, the external terminals 112 are electrically connected through the via conductors 115 to the wiring patterns 113 or sealing-use conductor pattern 117.

A projecting portion 116, in a planar view, is rectangular shaped and is provided at a position facing the free end side of the crystal element 120. It is for preventing the free end side of the crystal element 120 from contacting the substrate 110a. The projecting portion 116 is provided on the substrate 110a in the concave portion K so that the long side of the projecting portion 116 and the long side of the substrate 110a become substantially parallel. By configuring the device in this way, when an impact such as a fall is applied to the crystal device, a crack or the like due to contact of the free end side of the crystal element 120 with the substrate 110a and so on can be suppressed.

Here, taking as an example a case where the dimension of one side when viewing the package 110 by a planar view is 1.0 to 3.0 mm, and the dimension of the package 110 in the vertical direction is 0.7 to 1.5 mm, the sizes of the electrode pads 111 and projecting portion 116 will be explained. The length of the sides of the electrode pads 111 becomes 250 to 400 μm. The thickness of the electrode pads 111 in the vertical direction becomes 10 to 50 μm. Further, the length of the projecting portion 116 which becomes parallel to the long side direction of the substrate 110a is 500 to 800 μm, and the length of the projecting portion 116 which becomes parallel to the short side direction of the substrate 110a is 150 to 300 μm. Further, the length of the projecting portion 116 in the vertical direction is about 30 to 100 μm. Further, the thickness of the wiring patterns 113 in the vertical direction becomes 5 to 25 μm.

Further, the arithmetic mean surface roughness of the electrode pads 111 is 0.02 to 0.10 μm, and the arithmetic mean surface roughness of the surface of the substrate 110a is 0.5 to 1.5 μm. That is, the arithmetic mean surface roughness of the electrode pads 111 is smaller than the arithmetic mean surface roughness of the surface of the substrate 110a. Accordingly, the conductive adhesive 140 becomes hard to spread from the electrode pads 111 toward the top of the substrate 110a.

The sealing-use conductor pattern 117 performs the role of making the wettability of a connection member 131 better when bonding the package 110 to the lid 130 through the connection member 131. The sealing-use conductor pattern 117 is formed on the upper surface of the frame 110b to a thickness of for example 10 to 25 μm by for example applying nickel plating and gold plating in order to the surface of the conductor pattern made of tungsten or molybdenum in a form surrounding the opening of the frame 110b annularly.

The conductive adhesive 140 is comprised of a binder such as a silicone resin in which a conductive powder is contained as a conductive filler. As the conductive powder, any of aluminum, molybdenum, tungsten, platinum, palladium, silver, titanium, nickel, or ferronickel or a combination of these may be used. Further, as the binder, for example a silicone resin, epoxy resin, polyimide resin, or bismaleimide resin may be used.

The conductive adhesive 140 is arranged away from the excitation-use electrode 122 of the crystal element 120. In the crystal device, by the conductive adhesive 140 and the excitation-use electrode 122 being arranged away from each other, short-circuiting which occurs due to the deposition of the conductive adhesive 140 to the excitation-use electrode 122 can be reduced.

Further, by using a conductive adhesive 140 having a viscosity of 35 to 45 Pa·s, when coating, the conductive adhesive 140 will not flow out to the upper surface of the substrate 110a from the tops of the electrode pads 111, but will stay on the electrode pads 111, therefore the thickness of the conductive adhesive 140 in the vertical direction can be secured. The thickness of the conductive adhesive 140 in the vertical direction is 10 to 25 μm. By the thickness of the conductive adhesive 140 being able to be secured in this way, contact of the crystal element 120 with the substrate 110a is suppressed. Therefore, even when shock due to a fall or the like is applied to the crystal element 120 in the vertical direction centered about the conductive adhesive 140, that shock can be sufficiently absorbed and buffered by the conductive adhesive 140.

Here, a method of fabrication of the package 110 will be explained. In a case where the substrate 110a and the frame 110b are made of an alumina ceramic, first, a suitable organic solvent or the like is added to and mixed with a predetermined ceramic material powder to thus obtain a plurality of ceramic green sheets. Further, a predetermined conductor paste is coated by conventionally known screen printing or the like on the surfaces of the ceramic green sheets or in through-holes formed on advance by punching the ceramic green sheets etc. Further, these green sheets are stacked and press formed then fired at a high temperature. Finally, predetermined locations of the conductor patterns, specifically, locations which will form a pair of electrode pads 111 or external terminals 112 and the projecting portion 116, are nickel plated or gold plated etc. to fabricate the package 110. Further, the conductor paste is for example comprised of a sintered body of a metal powder such as tungsten, molybdenum, copper, silver, or silver palladium.

The crystal element 120, as shown in FIGS. 2A to 2C and FIG. 3A, is bonded onto the electrode pads 111 through the conductive adhesive 140. The crystal element 120 performs the role of oscillating the reference signal of the electronic equipment or the like by stable mechanical vibration and piezoelectric effect.

The crystal element 120, as shown in FIG. 1 and FIGS. 2A to 2C, has a structure in which the upper surface and the lower surface of the crystal plate 121 are respectively coated with excitation-use electrodes 122 and leadout electrodes 123. The excitation-use electrodes 122 are respectively formed by coating metal on the upper surface and the lower surface of the crystal plate 121 with a predetermined pattern. The excitation-use electrodes 122 have a first excitation-use electrode 122a on the upper surface and a second excitation-use electrode 122b on the lower surface. The leadout electrodes 123 extend from the excitation-use electrodes 122 toward one side of the crystal plate 121. The leadout electrodes 123 have a first leadout electrode 123a on the upper surface and a second leadout electrode 123b on the lower surface. The first leadout electrode 123a is led out from the first excitation-use electrode 122a and extends toward one side of the crystal plate 121. The second leadout electrode 123b is led out from the second excitation-use electrode 122b and extends toward one side of the crystal plate 121. That is, the leadout electrodes 123 are provided in a shape following along the long side or short side of the crystal plate 121. Further, in the present embodiment, the crystal element 120 is fixed onto the substrate 110a by a cantilever structure in which one end of the crystal element 120 which is connected to the first electrode pad 111a and second electrode pad 111b is formed as a fixed end which is connected to the upper surface of the substrate 110a and the other end is formed as the free end spaced apart from the upper surface of the substrate 110a.

Figure 4A:
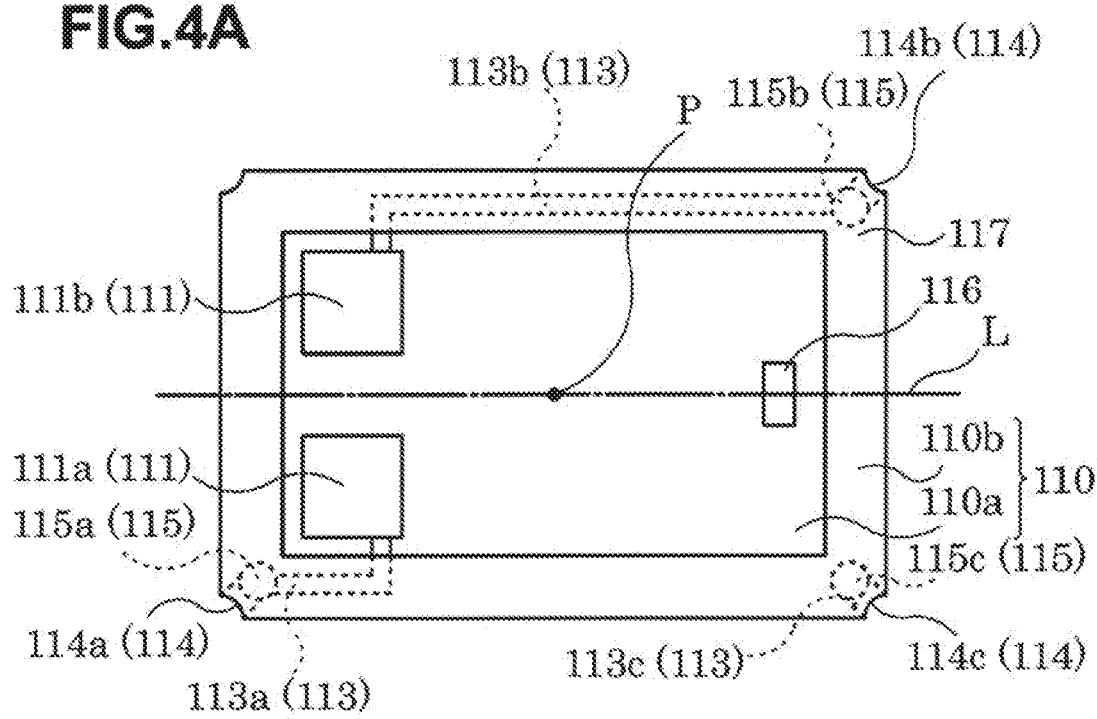
FIG. 4A is a plan view of a package configuring the crystal device in the first embodiment seen from the top.

Further, in the crystal device, the surface of the excitation-use electrode 122 of the crystal element 120 is ablated by for example an ion gun to adjust the oscillation frequency of the crystal element 120. Further, in a conventional crystal device, the wiring patterns provided on the upper surface of the substrate are also exposed in the vicinity of the excitation-use electrode of the crystal element. Therefore, when ablating the excitation-use electrode by an ion gun, the wiring patterns are sometimes ablated. Further, in a conventional crystal device, the ablated pieces of the wiring patterns are liable to deposit on the excitation-use electrodes of the crystal element, therefore the oscillation frequency is liable to fluctuate. In the crystal device of the present embodiment, however, as shown in FIG. 4A, the wiring patterns 113 are not exposed in the concave portion K in the vicinity of the excitation-use electrode 122 of the crystal element 120 but are provided at positions where they are superimposed on the frame 110b when viewed by a planar view. Therefore, when ablating the excitation-use electrode 122 by the ion gun, ablation of the wiring patterns 113 can be prevented. Further, in such a crystal device, ablated pieces of the wiring patterns 113 are not generated, therefore ablated pieces will not deposit on the excitation-use electrodes 122 of the crystal element 120, so it becomes possible to stably output the oscillation frequency.

Here, the operation of the crystal element 120 will be explained. In the crystal element 120, when an alternating voltage from the outside is applied from the leadout electrodes 123 through the excitation-use electrodes 122 to the crystal plate 121, the crystal plate 121 causes excitation in a predetermined vibration mode and frequency.

Here, a method of production of the crystal element 120 will be explained. First, a crystal plate 121 is cut out at a predetermined cut angle from synthetic crystal and is beveled to reduce the thickness of the outer circumference of the crystal plate 121 and become thicker at the center portion of the crystal plate 121 compared with the outer circumference of the crystal plate 121. Then, the two major surfaces of the crystal plate 121 are covered with a metal film by photolithography, vapor deposition, or sputtering to form the excitation-use electrodes 122 and leadout electrodes 123. The crystal element 120 is produced in this way.

Further, the method of production for forming such a crystal element 120 by using photolithography and etching will be explained. First, a crystal wafer having crystal axes comprised of a perpendicular X-axis, Y-axis, and Z-axis is prepared. At this time, the major surface of the crystal wafer becomes parallel to a plane obtained by rotating a plane parallel to the X-axis and Z-axis counterclockwise about the X-axis when viewing the negative direction of the X-axis, for example, the plane obtained by rotating it by an angle of 35° to 40° (for example about 37°). Next, on the two major surfaces of the crystal wafer, metal films are formed by using the sputtering technique or vapor deposition technique. Photo-sensitive resists are coated on these metal films and are exposed and developed to form predetermined patterns so that the crystal wafer is exposed at only predetermined portions. The crystal wafer exposed at only predetermined portions in this way is immersed in a predetermined etching solution, whereby the crystal wafer is etched. Due to this, a plurality of crystals 120 are formed in the crystal wafer in a state where parts are connected.

A method of bonding a crystal element 120 to the substrate 110a will be explained next. First, the conductive adhesive 140 is coated by for example a dispenser so as to spread over the top of the electrode pads 111. A crystal element 120 is conveyed onto the conductive adhesive 140. Further, the crystal element 120 is placed on the conductive adhesive 140 so that the leadout electrode 123 which is positioned on the outer circumferential edge at the fixed end side of the crystal element 120 is superimposed on the portion near the center of the conductive adhesive 140 when viewed by a planar view. Then, the conductive adhesive 140 is heated to cure it and contracts by curing.

The lid 130 is rectangular shaped and is for air-tight sealing the concave portion K in a vacuum state or the concave portion K filled with nitrogen gas or the like. Specifically, the lid 130 is placed in a predetermined atmosphere on the upper surface of a bonding member 131 which is provided on the frame 110b. By application of heat to the bonding member 131 provided on the upper surface of the frame 110b, the frame 110b and the lid 130 are melt bonded. Further, the lid 130 is made of an alloy containing for example at least one of iron, nickel, and cobalt.

The bonding member 131 is provided at a location of the lid 130 facing the sealing-use conductor pattern 117 provided on the upper surface of the frame 110b of the package 110. The bonding member 131 is for example provided by silver solder or gold tin. In the case of silver solder, the thickness is 10 to 20 μm. For example, one having a component ratio of 72 to 85% of silver and 15 to 28% of copper is used. In the case of gold tin, the thickness is 10 to 40 μm. For example, one having a component ratio of 78 to 82% of gold and 18 to 22% of tin is used.

Regarding the bonding member 131, for example, in the case of gold tin, the thickness of the layer of the bonding member 131 is 10 to 40 μm, and for example, one having a component ratio of 70 to 80% of gold and 20 to 30% of tin may be used as well. Further, regarding the bonding member 131, for example, in the case of silver solder, the thickness of the layer of the bonding member 131 is 10 to 40 μm, and for example, one having a component ratio of 70 to 80% of silver and 20 to 30% of copper may be used as well.

A crystal device in the present embodiment is provided with a rectangular substrate 110a, a frame 110b which is provided along the outer circumferential edge of the upper surface of the substrate 110a, electrode pads 111 which are provided on the upper surface of the substrate 110a, wiring patterns 113 which are electrically connected to the electrode pads 111 and are provided on the upper surface of the substrate 110a, a crystal element 120 which is mounted on the electrode pads 111, and a lid 130 for air-tight sealing the crystal element 120. The thickness of the electrode pads 111 in the vertical direction becomes thicker than the thickness of the wiring patterns 113 in the vertical direction. By configuring the device in this way, steps are provided at the borders between the electrode pads 111 and the wiring patterns 113, the radius of curvature of the interface of the conductive adhesive 140 at the steps becomes small, and the surface free energy becomes large, therefore it becomes harder for the conductive adhesive 140 coated on the electrode pads 111 to ride over the steps and leak and spread onto the tops of the wiring patterns 113. Accordingly, in such a crystal device, the crystal element 120 can be stably mounted on the electrode pads 111 through the conductive adhesive 140, therefore fluctuation of the oscillation frequency of the crystal element 120 can be reduced.

In the crystal device in the present embodiment, the wiring patterns 113 are provided at positions where they are superimposed on the frame 110b when viewed by a planar view. By doing this, the crystal device can suppress generation of stray capacitance between the wiring patterns 113 and the crystal element 120. Further, in such a crystal device, since the stray capacitance given to the crystal element 120 is reduced, fluctuation of the oscillation frequency can be reduced. Further, in the crystal device in the present embodiment, even when external force is applied to the crystal device and a bending moment is generated in the long side direction of the frame 110b, because of the provision of the frame 110b in addition to the substrate 110a, the location where the frame 110b is provided becomes hard to deform. Accordingly, the wiring patterns 113 which are provided at the positions where they are superimposed on the frame 110b when viewed by a planar view become resistant to breakage, therefore the output of oscillation frequency of the crystal device can be kept from being stopped.

Further, in the crystal device of the present embodiment, parts of the wiring patterns 113 extend from the electrode pads 111 toward the long side of the frame 110b and are exposed. In this way, since parts of the wiring patterns 113 extend from the electrode pads 111 toward the long side of the frame 110b and are exposed in the concave portion K, when mounting the crystal element 120, even if the conductive adhesive 140 overflows from the tops of the electrode pads 111, it flows out along the tops of the wiring patterns 113 having a good wettability with the conductive adhesive 140, therefore it will not flow out to the center direction of the package 110, so deposition of the conductive adhesive 140 to the excitation-use electrode 122 can be suppressed.

Further, in the crystal device in the present embodiment, parts of the wiring patterns 113 become line symmetric with respect to the line L which passes through the center point P of the substrate 110a and is parallel to the long sides of the substrate 110a. By the exposed first wiring pattern 113a and the exposed second wiring pattern 113b being provided at positions where they become line symmetric with respect to the line L which passes through the center point P of the substrate 110a and is parallel to the long sides of the substrate 110a in this way, even if the conductive adhesive 140 overflows from the tops of the electrode pads 111 when mounting the crystal element 120, the amounts of the overflowing conductive adhesive 140 easily become even, therefore inclination of the crystal element 120 can be suppressed.

Further, the crystal device in the present embodiment is provided with the projecting portion 116 which is provided on the upper surface of the substrate 110a along a side of the crystal element 120 facing one side of the substrate 110a. By configuring the device in this way, when a fall or other shock is applied to the crystal device, the free end side of the crystal element 120 contacts the projecting portion 116, therefore cracks or the like due to direct contact with the substrate 110a can be suppressed.

Second Embodiment

A crystal device according to a second embodiment, as shown in FIG. 5 and FIGS. 6A to 6C, differs from the crystal device in the first embodiment only in the relative relationship between the thickness of the electrode pads 111 and the thickness of the wiring patterns 113.

Figure 6A:
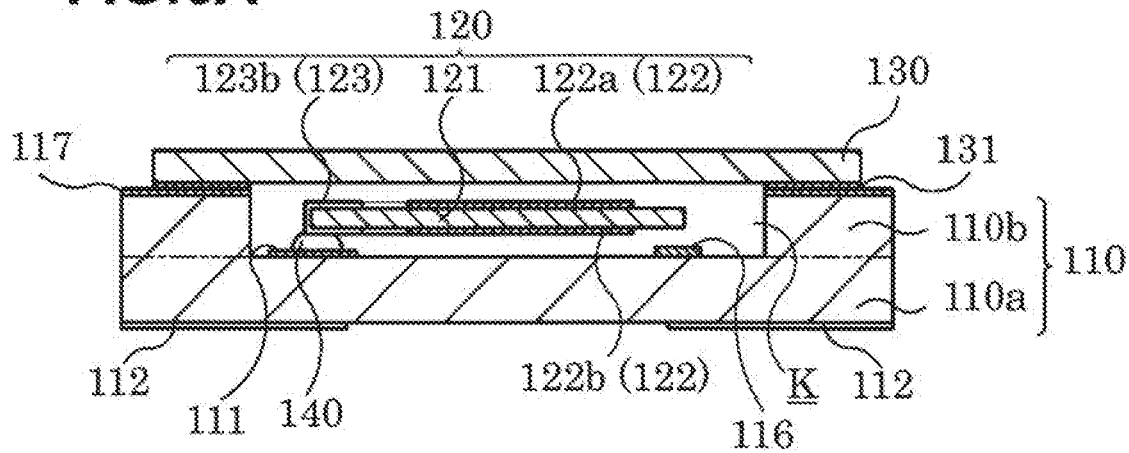
FIG. 6A is a cross-sectional view taken along VIa-VIa of the crystal device shown in FIG. 5.
Figure 6B:
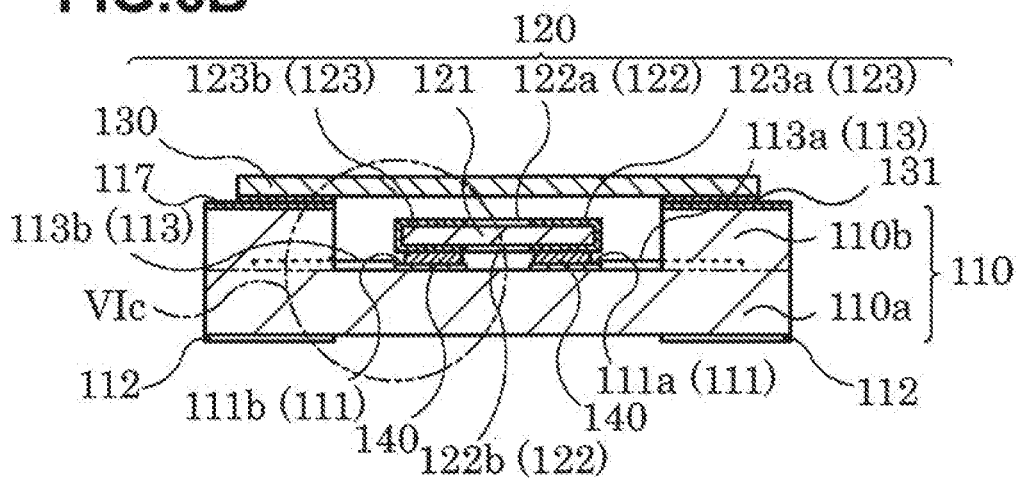
FIG. 6B is a cross-sectional view taken along VIb-VIb of the crystal device shown in FIG. 5.
Figure 6C:
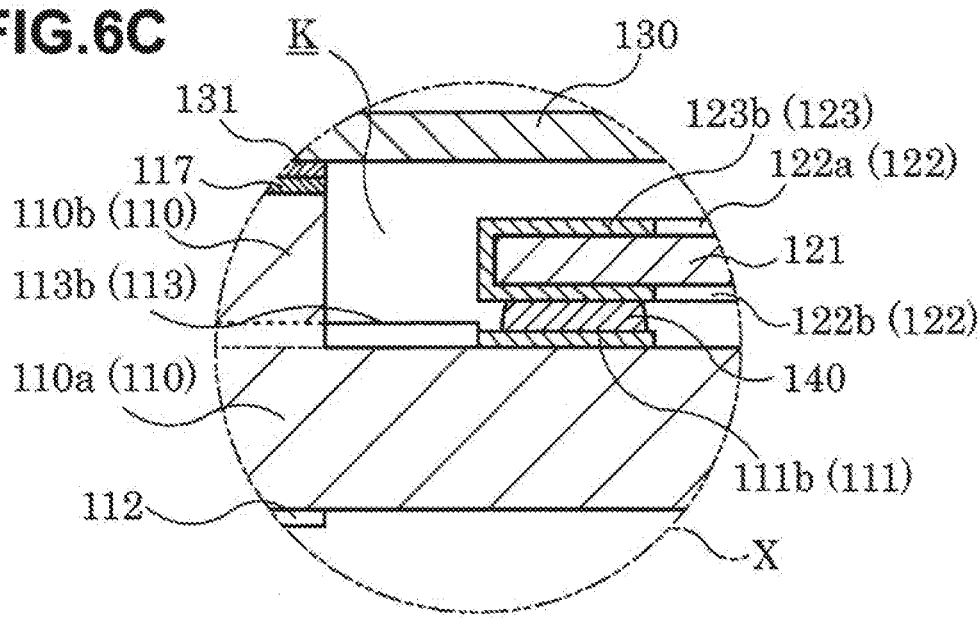
FIG. 6C is an enlarged diagram of a Vac portion in FIG. 6B.

Specifically, the electrode pads 111 are provided so that their thickness in the vertical direction becomes thinner than the thickness of the wiring patterns 113 in the vertical direction as shown in FIG. 6C. When giving one example of the dimensions, the thickness of the electrode pads 111 in the vertical direction is 10 to 50 μm in the same way as the first embodiment, and the thickness of the wiring patterns 113 in the vertical direction is 20 to 80 μm unlike the first embodiment.

Figure 4B:
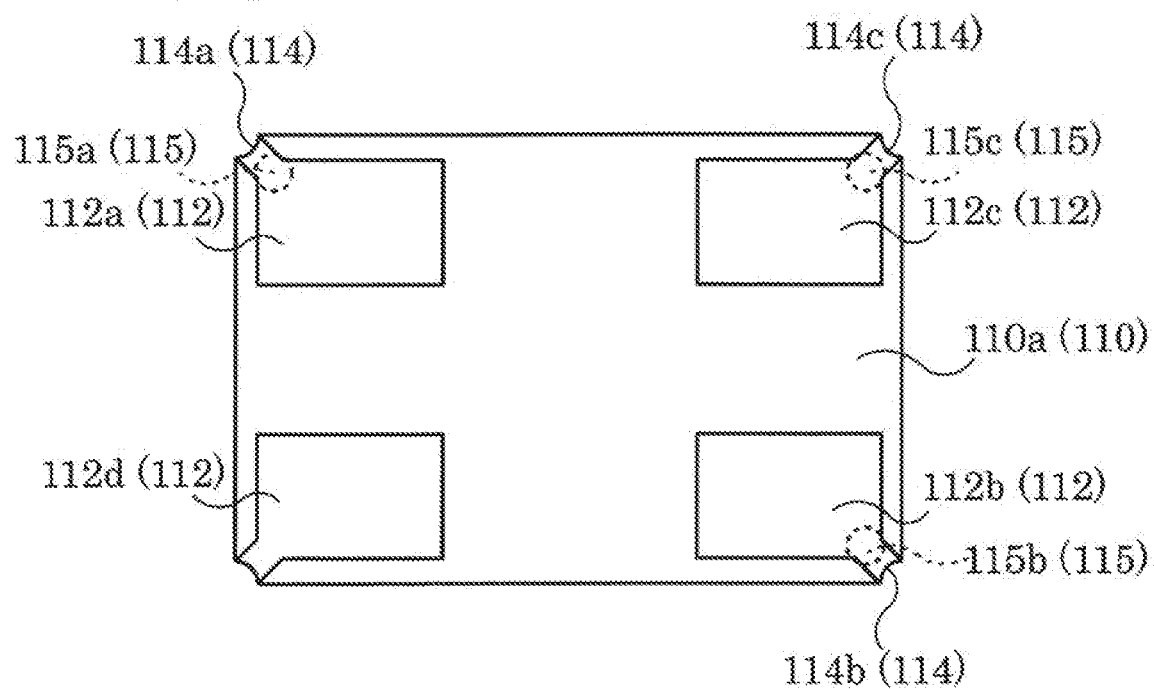
FIG. 4B is a plan view of a package configuring the crystal device in the first embodiment seen from the bottom.
Figure 5:
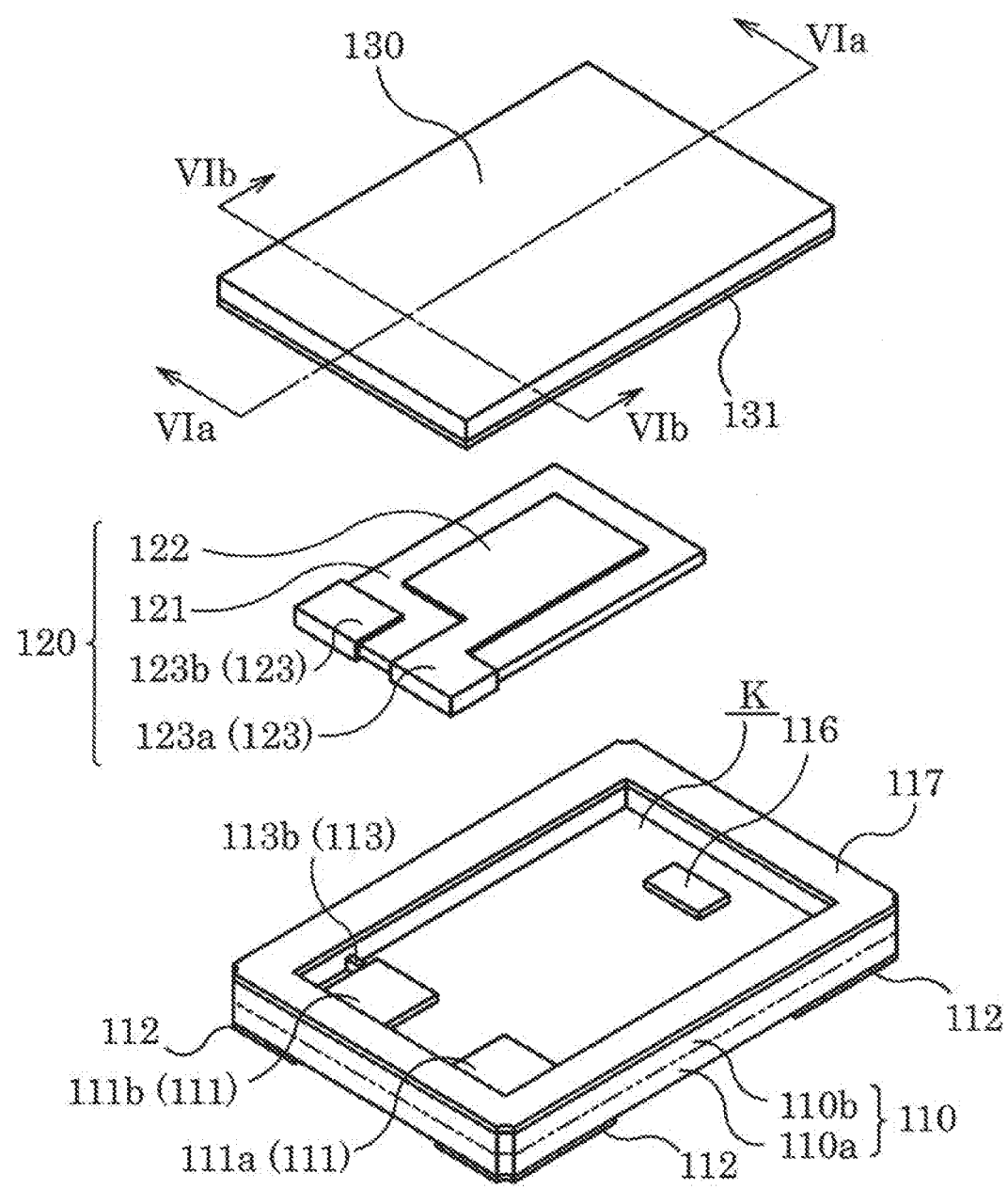
FIG. 5 is a disassembled perspective view showing a crystal device in a second embodiment.

Note that, other than the above matters, the structure, material, dimensions, and method of production of the crystal device according to the present embodiment may be the same as those in the first embodiment. For example, all of the description for the explanation of the first embodiment can be applied as the explanation of the second embodiment except for the description that the thickness of the electrode pads 111 is greater than the thickness of the wiring patterns 113 and the description of a concrete example of the thickness of the wiring patterns 113 in the vertical direction (5 to 25 μm). Further, FIG. 3 and FIGS. 4A and 4B can be applied as diagrams showing the crystal device of the second embodiment.

In this way, the crystal device in the present embodiment is provided with a rectangular substrate 110a, a frame 110b which is provided along the outer circumferential edge of the upper surface of the substrate 110a, electrode pads 111 which are provided on the upper surface of the substrate 110a, wiring patterns 113 which are electrically connected to the electrode pads 111 and are provided on the upper surface of the substrate 110a, a crystal element 120 which is mounted on the electrode pads 111, and a lid 130 for air-tight sealing the crystal element 120, where the thickness of the electrode pads 111 in the vertical direction becomes smaller than the thickness of the wiring patterns 113 in the vertical direction.

Accordingly, effects the same as those by the first embodiment are exhibited. For example, steps are provided at the borders between the electrode pads 111 and the wiring patterns 113, the radius of curvature of the interface of the conductive adhesive 140 in the steps becomes small, and the surface free energy becomes large, therefore it becomes harder for the conductive adhesive 140 coated on the electrode pads 111 to ride over the steps and leak and spread onto the tops of the wiring patterns 113.

Further, in the present embodiment as well, the effect of the wiring patterns 113 being provided at positions where they are superimposed on the frame 110b when viewed by a planar view, the effect of parts of the wiring patterns 113 being provided so as to extend from the electrode pads 111 toward the long side of the frame 110b and be exposed, the effect of parts of the wiring patterns 113 becoming line symmetric with respect to the line L which passes through the center point P of the substrate 110a and is parallel to the long sides of the substrate 110a, the effect of the projecting portion 116 being provided on the substrate 110a along the side of the crystal element 120 facing one side of the substrate 110a, and other effects according to various preferred aspects are exhibited.

First Modification

Figure 7A:
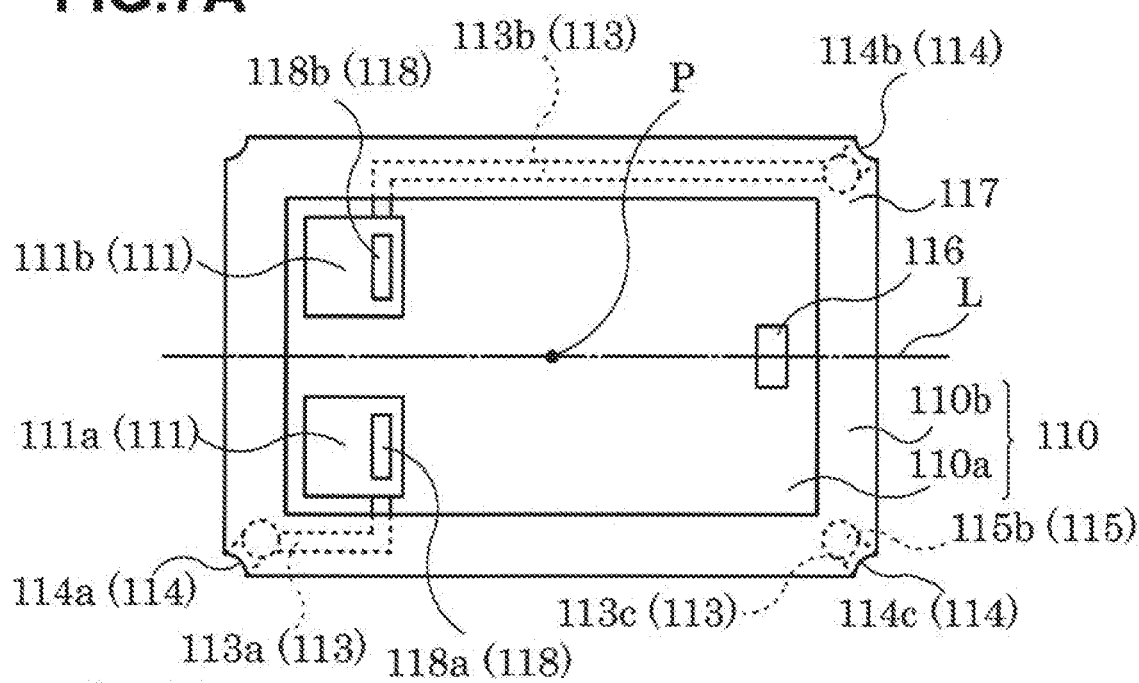
FIG. 7A is a plan view of a package configuring the crystal device in a first modification seen from the top.
Figure 7B:
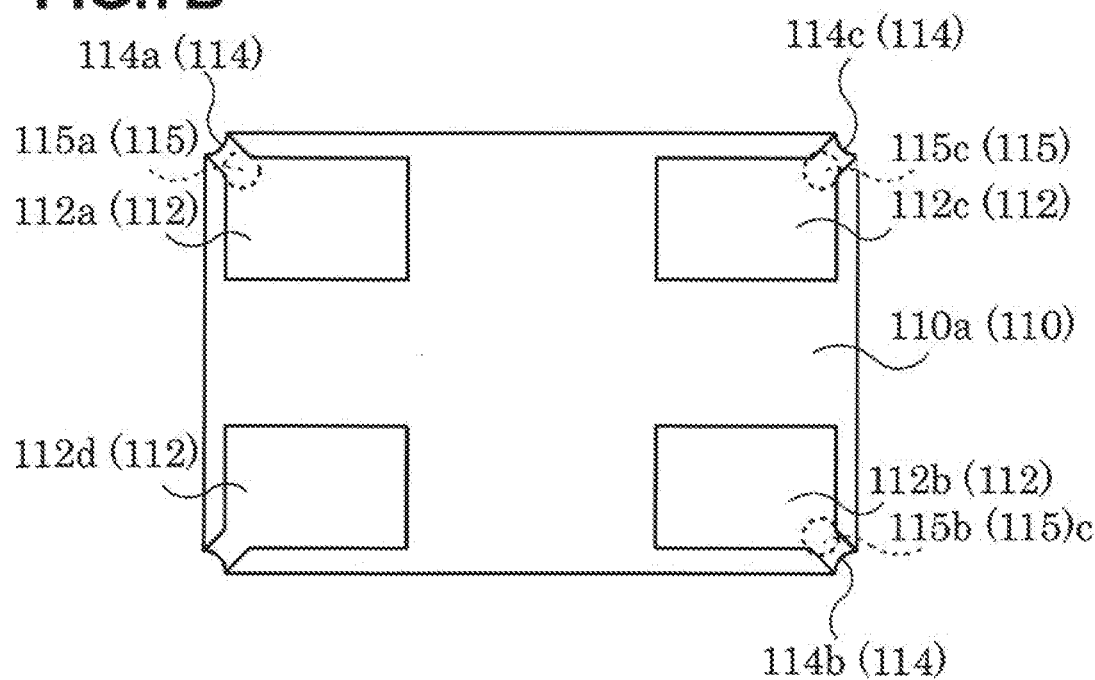
FIG. 7B is a plan view of the package configuring the crystal device in the first modification seen from the bottom.

A crystal device of a first modification of the first or second embodiment, as shown in FIGS. 7A and 7B, differs from the crystal devices in the embodiments in the point that protruding portions 118 are provided on the electrode pads 111. As shown in FIG. 7A, the pair of protruding portions 118 which are rectangular shaped when viewed by a planar view is provided on the pair of electrode pads 111. Further, in each of the pair of protruding portions 118, in a plan view, its single side is provided along the outer circumferential edge of the electrode pad 111 which faces the center side of the substrate 110a, the other side which is connected to the above single side is provided along the outer circumferential edge of the electrode pad 111 which faces the outer circumferential edge side of the substrate 110a.

The protruding portions 118 are for suppressing the inclination of the short side of the crystal element 120 in the vertical direction and suppressing contact of the end part on the long side of the crystal element 120 to the substrate 110a or the lid 130. Further, the protruding portions 118 are for suppressing contact of the free end of the crystal element 120 with the substrate 110a. The pair of protruding portions 118 is configured by a first protruding portion 118a and second protruding portion 118b. The first protruding portion 118a is provided on the upper surface of the first electrode pad 111a, while the second protruding portion 118b is provided on the upper surface of the second electrode pad 111b. Further, the protruding portions 118 are, in the same way as the electrode pads 111, provided by for example gold plating and nickel plating the upper surface of a sintered body of a metal powder etc. of tungsten, molybdenum, copper, silver, silver palladium or the like.

Further, the pair of protruding portions 118 is provided so that the sides which face the center side of the substrate 110a are arranged on the same line as shown in FIG. 7A. By doing this, when mounting the crystal element 120 on the electrode pads 111 while bringing the leadout electrodes 123 of the crystal element 120 into contact with the pair of protruding portions 118, they can be mounted in a stable state without inclination of the crystal element 120. Further, the length in the long side direction of the side of a protruding portion 118 which is formed along the outer circumferential edge of the electrode pad 111 becomes 150 to 200 μm, while the length in the short side direction of the side of the protruding portion 118 becomes 50 to 75 μm. The thickness of the protruding portion 118 in the vertical direction becomes 20 to 75 μm. The length of the protruding portion 118 in the long side direction becomes 150 to 300 μm, while the length in the short side direction of the side of the protruding portion 118 becomes 50 to 75 m. The thickness of the protruding portion 118 in the vertical direction becomes 20 to 75 μm.

Further, the protruding portions 118 are provided at positions where they face the leadout electrode 123 which is located on the outer circumferential edge of the crystal element 120. By doing this, when the crystal element 120 is mounted on the electrode pads 111 through the conductive adhesive, even if the crystal element 120 is inclined, the leadout electrode 123 contacts the protruding portions 118, therefore the crystal element 120 can be mounted in a stable state without being inclined in a direction lower than the protruding portions 118. Further, the protruding portions 118, when viewed by a planar view, are provided at positions where they are superimposed on the leadout electrode 123 which is located at the outer circumferential edge on the fixed end side of the crystal plate 121. By doing this, contact of the fixed end of the crystal element 120 with the upper surface of the substrate 110a can be reduced.

Further, in the crystal element 120, when the conductive adhesive 140 is cured and contracts, the fixed end side of the crystal element 120 is pulled to a downward direction, therefore the principle of a lever using the protruding portions 118 as the fulcra ends up acting, therefore the crystal element 120 is bonded to the pair of electrode pads 111 with its free end side floating in an upward direction. Further, when the fixed end side of the crystal element 120 is pulled in the downward direction at the time of curing and contraction of the conductive adhesive 140, it is bonded to the electrode pads 111 in a state where the protruding portions 118 and the leadout electrode 123 which is on the outer circumferential edge of the crystal element 120 contact.

The first leadout electrode 123a of the crystal element 120, as shown in FIG. 3, contacts the first protruding portion 118a, while the second leadout electrode 123b of the crystal element 120 contacts the second protruding portion 118b. By bringing the leadout electrodes 123 of the crystal element 120 into contact with the protruding portions 118 in this way, in the process of mounting the crystal element 120 on the electrode pads 111, even in a case where the mount position of the crystal element 120 is off and the mount angle is inclined, the end part of the crystal element 120 on the long side abuts against the protruding portions 118 and is supported, therefore the inclination of the short side of the crystal element 120 is suppressed and contact of the end part on the long side of the crystal element 120 with the substrate 110a and lid 130 can be prevented. Accordingly, fluctuation of the oscillation frequency of the crystal element 120 is prevented, therefore the productivity can be improved.

Further, the leadout electrodes 123 of the crystal element 120 end up contacting the protruding portions 118, therefore contact of the outer circumferential edge on the fixed end side of the crystal element 120 with the upper surface of the substrate 110a can be reduced. Accordingly, cracking of the crystal element 120 caused due to contact of the outer circumferential edge of the fixed end side of the crystal element 120 with the substrate 110a can be prevented. Further, even if the crystal element 120 is inclined at the time of mounting, due to the leadout electrode 123 of the crystal element 120 contacting the protruding portions 118, it is possible to secure a distance of the amount of the thickness of the protruding portions 118 in the vertical direction between the fixed end side of the crystal element 120 and the substrate 110a, therefore the free end of the crystal element 120 does not float too much and contact of the free end of the crystal element 120 with the lid 130 can be suppressed.

Further, in the crystal device of the present embodiment, the electrode pads 111 are provided along one side of the substrate 110a and provision is made of protruding portions 118 on the upper surfaces of the electrode pads 111. When mounting the crystal element 120 on the electrode pads 111 through the conductive adhesive 140, even if the crystal element 120 is inclined, the leadout electrode 123 will contact the protruding portions 118, therefore the crystal element 120 can be mounted in a stable state without inclination in a direction below the protruding portions 118. Further, the protruding portions 118, when viewed by a planar view, are provided at positions where they are superimposed on the leadout electrodes 123 on the outer circumferential edge on the fixed end side of the crystal plate 121. By doing this, contact of the fixed end of the crystal element 120 with the upper surface of the substrate 110a can be reduced.

Note, the invention is not limited to the present embodiment and can be changed, improved, etc. in various ways to an extent not departing from the gist of the invention. In the above embodiments, the explanation was given of the case where the frame 110b is provided on the upper surface of the substrate 110a, but a structure in which the crystal is mounted on the substrate, then a lid provided with a sealing frame on the lower surface of the sealing base part is used to air-tightly seal the crystal may be employed as well. The lid is configured by a rectangular sealing base part and a sealing frame which is provided along the outer circumferential edge of the lower surface of the sealing base part. A holding space is formed by the lower surface of the sealing base part and the inner side surfaces of the sealing frame. The sealing frame is for forming the holding space on the lower surface of the sealing base part. The sealing frame is provided along the outer edge of the lower surface of the sealing base part.

In the above embodiments, the explanation was given of the case where the frame 110b is provided on the upper surface of the substrate 110a, but a structure in which the crystal is mounted on the substrate, then a lid provided with a wall part on the lower surface is used to air-tightly seal the crystal may be employed as well.

In the above embodiments, the explanation was given of the case where the crystal element used was an AT-use crystal element, but a tuning fork type flexural crystal element having a base part and two flat plate-shaped vibrating arms which extend in the same direction from the side surfaces of the base part may be used as well. The crystal element is configured by a crystal plate, excitation electrodes provided on the surfaces of that crystal plate, leadout electrodes, and frequency adjustment-use metal films. The crystal plate is configured by a crystal base part and crystal vibration parts. The crystal vibration parts are configured by a first crystal vibration part and second crystal vibration part. The crystal base part is a flat plate which is substantially square when viewed by a planar view and in which when, as the axial directions of the crystal, employing an orthogonal coordinate system where the electrical axis becomes the X-axis, the mechanical axis becomes the Y-axis, and the optical axis becomes the Z-axis, the direction of the Z'-axis which is obtained by rotation around the X-axis within a range of −5° to +5° becomes the thickness direction. The first crystal vibration part and the second crystal vibration part extend parallel to the direction of the Y'-axis from one side of the crystal base part. Such a crystal plate forms a tuning fork shape in which the crystal base part and the crystal vibration parts are integrally formed and is produced by the photolithography technique and chemical etching technique.

Priorities are claimed on Japanese application No. 2015-127230, filed on Jun. 25, 2015 and Japanese application No. 2015-167614, filed on Aug. 27, 2015, the content of which are incorporated herein by reference.

REFERENCE SIGNS LIST

110 . . . package
110a . . . substrate
110b . . . frame
111 . . . electrode pad
112 . . . external terminal
113 . . . wiring pattern
114 . . . conductor portion
115 . . . via conductor
116 . . . projecting portion
117 . . . sealing-use conductor pattern
118 . . . protruding portion
120 . . . crystal element
121 . . . crystal plate
122 . . . excitation-use electrode
123 . . . leadout electrode
130 . . . lid
131 . . . bonding member
140 . . . conductive adhesive
K . . . concave portion

The invention claimed is:

1. A crystal device comprising:
a rectangular substrate,
a frame which is provided along an outer circumferential edge of an upper surface of the substrate,
an electrode pad which is provided on the upper surface of the substrate,
a wiring pattern which is electrically connected to the electrode pad, is provided on the upper surface of the substrate and is narrower than the electrode pad at a position connected to the electrode pad,
a crystal element which is mounted on the electrode pad and comprises a crystal blank, the crystal blank comprising a surface facing the upper surface of the substrate, and the surface of the crystal blank being flat, and
a lid for air-tight sealing the crystal element, wherein
a thickness of the electrode pad in a vertical direction is constant over the whole of the electrode pad and greater than a thickness of the wiring pattern in the vertical direction.

2. A crystal device comprising:
a rectangular substrate,
a frame which is provided along an outer circumferential edge of an upper surface of the substrate,
an electrode pad which is provided on the upper surface of the substrate,
a wiring pattern which is electrically connected to the electrode pad and is provided on the upper surface of the substrate,
a crystal element which is mounted on the electrode pad, and
a lid for air-tight sealing the crystal element,
wherein a thickness of the electrode pad in a vertical direction is smaller than a thickness of the wiring pattern in the vertical direction.

3. The crystal device according to claim 1, wherein the wiring pattern is provided so as to be superimposed on the frame when viewed by a planar view.

4. The crystal device according to claim 1, wherein a portion of the wiring pattern is provided so as to extend from the electrode pad toward a long side of the frame and be exposed.

5. The crystal device according to claim 4, comprising:
a pair of the wiring patterns, wherein
the portions of the wiring patterns become line symmetric with a line L which passes through a center point P of the substrate and is parallel to the long sides of the substrate.

6. The crystal device according to claim 1, comprising:
a pair of the electrode pads, wherein
the electrode pads are provided along one side of the substrate, and
protruding portions provided on the upper surfaces of the electrode pads.

7. The crystal device according to claim 1, further comprising a projecting portion which is provided on the upper surface of the substrate and faces a side of the crystal element.

* * * * *